(12) United States Patent
Fitzgerald et al.

(10) Patent No.: US 9,515,003 B1
(45) Date of Patent: Dec. 6, 2016

(54) EMBEDDED AIR CORE INDUCTORS FOR INTEGRATED CIRCUIT PACKAGE SUBSTRATES WITH THERMAL CONDUCTOR

(71) Applicant: INTEL CORPORATION, Santa Clara, CA (US)

(72) Inventors: Thomas Fitzgerald, Phoenix, AZ (US); William Lambert, Chandler, AZ (US); Shrenik Kothari, Phoenix, AZ (US); Punita Sullhan, Gilbert, AZ (US); Aravindha Antoniswamy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/962,857

(22) Filed: Dec. 8, 2015

(51) Int. Cl.
| | |
|---|---|
| *H01L 23/367* | (2006.01) |
| *H01L 49/02* | (2006.01) |
| *H01L 23/498* | (2006.01) |
| *G06F 1/20* | (2006.01) |
| *H01L 23/522* | (2006.01) |
| *H01L 23/34* | (2006.01) |
| *H01L 23/00* | (2006.01) |
| *H01L 23/31* | (2006.01) |

(52) U.S. Cl.
CPC ............ *H01L 23/3672* (2013.01); *G06F 1/20* (2013.01); *H01L 23/345* (2013.01); *H01L 23/49811* (2013.01); *H01L 23/49822* (2013.01); *H01L 23/5227* (2013.01); *H01L 28/10* (2013.01); *H01L 23/3128* (2013.01); *H01L 23/49816* (2013.01); *H01L 24/18* (2013.01)

(58) Field of Classification Search
CPC .. H01L 23/3128; H01L 28/10; H01L 23/5227; H01L 23/345; H01L 23/49816; H01L 24/18

See application file for complete search history.

(56) References Cited

U.S. PATENT DOCUMENTS

| | | | | |
|---|---|---|---|---|
| 6,362,525 | B1* | 3/2002 | Rahim ............. | H01L 23/49838 257/528 |
| 8,110,895 | B2* | 2/2012 | Imaoka ............ | H01L 23/49838 257/531 |
| 8,143,108 | B2* | 3/2012 | Pendse ................. | H01L 21/563 257/E23.106 |
| 9,171,797 | B2* | 10/2015 | Lin ..................... | H01L 21/6835 |
| 2004/0238934 | A1* | 12/2004 | Warner ................. | H01L 23/24 257/686 |
| 2010/0071944 | A1* | 3/2010 | Endo .................... | H01L 21/4853 174/260 |

* cited by examiner

*Primary Examiner* — Alonzo Chambliss
(74) *Attorney, Agent, or Firm* — Blakely, Sokoloff, Taylor & Zafman LLP

(57) ABSTRACT

Embedded air core inductors are described for integrated circuit package substrates. The substrates have a thermal conductor for the inductors. One example includes a package substrate to carry an integrated circuit die, the package substrate having a plurality of top side pads to connect to the die on a top side and a plurality of bottom side pads to connect to an external component on a bottom side. An inductor is embedded within the package substrate, A thermal conductor is embedded within the package substrate adjacent to the inductor to conduct heat away from the inductor, and a heat sink is thermally coupled to the thermal conductor to receive the heat from the conductor.

20 Claims, 6 Drawing Sheets

EMBEDDED AIR CORE INDUCTORS FOR INTEGRATED CIRCUIT PACKAGE SUBSTRATES WITH THERMAL CONDUCTOR

FIELD

The present description relates to inductors embedded in integrated circuit package substrates and, in particular, to inductors with thermal conductors.

BACKGROUND

Integrated circuit dies contain an array of circuits that all require a very precisely controlled voltage and current. In some cases, the power supplied to each circuit is controlled with an external voltage regulator. In order to save space, part of the power supply is integrated onto the circuitry in the die. By using multiple on-die voltage regulators, the power to different parts of the circuitry can be controlled independently. This structure with multiple small voltage regulators can be used to reduce power in some sections that are not active or that are less active which saves energy overall. On-die voltage regulation can also be used to throttle voltages in real time and thereby provide active power management.

Some of the components for a power supply are not formed on the integrated circuit die. Passive components, such as inductors, transformers, and capacitors are difficult to form in the same process that is used to make transistors and may be too large to place on the die. Components formed outside of the die have more room and can be made to higher quality at less cost. For on-die voltage regulators, inductors can be mounted to a package substrate or embedded within a package substrate.

Integrated circuit dies are typically packaged for protection and to provide convenient external connections. The package has a package substrate that connects to one or more integrated circuit dies on one side and to a socket or printed circuit board on the other side. The integrated circuit dies may then be covered for protection. The substrate provides a convenient location to place passive devices with a simple connection pathway to the integrated circuit dies and to any external components.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
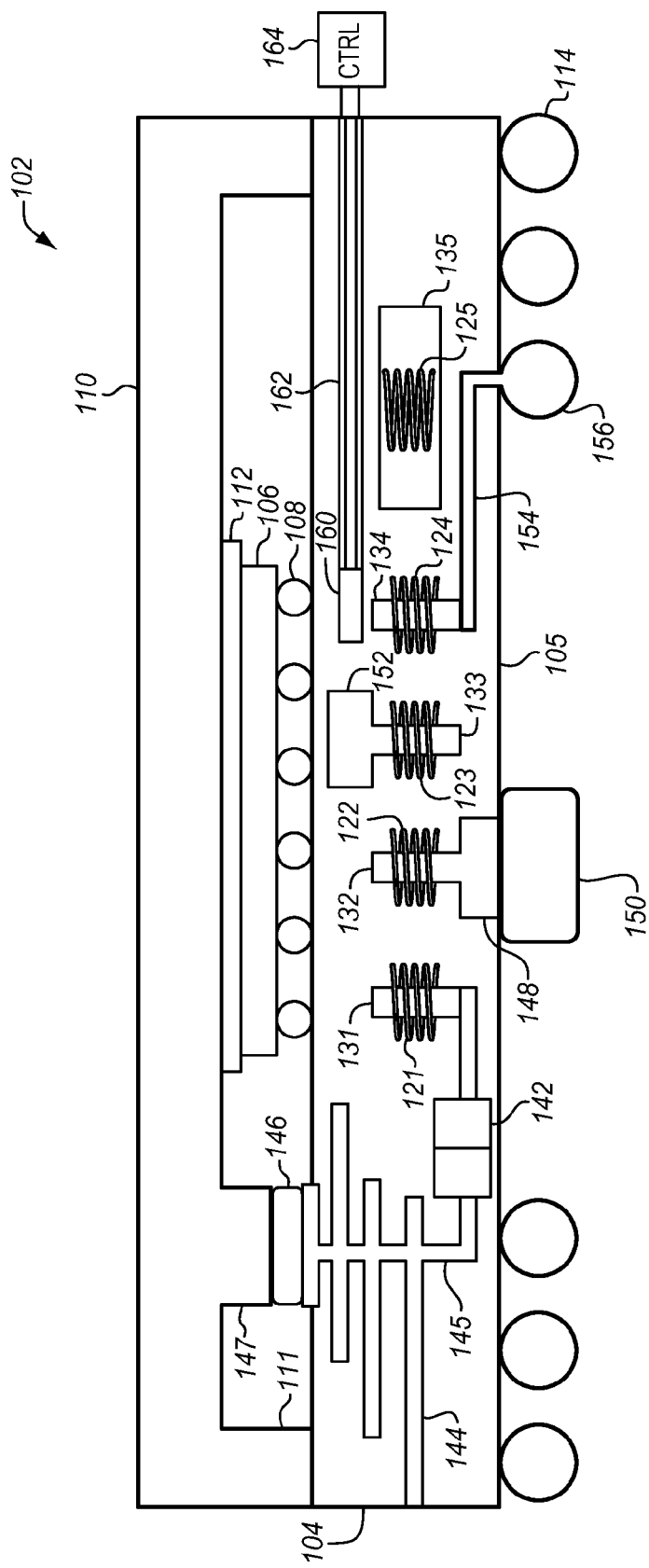
FIG. 1 is a side cross-sectional view diagram of an integrated circuit package with embedded coils having different cooling mechanisms according to an embodiment.

Any coil that carries current develops heat. The heat is determined in part by the amount of current, the number of turns in the coil, and the resistance in the coil. The smaller the coil, the more the heat is concentrated in a smaller space. With the increased miniaturization of integrated circuit packages and the increased number of functions performed by a package, there are more coils in less space. If there is too much heat concentrated in too small of a space, then the coil may be damaged or fail or the surrounding structure may be damaged.

In some packages ACIs (Air Core Inductors) are embedded into or attached to a package substrate. These ACIs may be used for many different purposes. One such purpose is to support a FIVR (fully integrated voltage regulator). The FIVR provides one or more voltage regulators directly within an integrated circuit die for each core of the integrated circuit. Smaller dies and more cores mean more voltage regulators and more ACIs. This creates more heat in a smaller place. In some packages, the cores are also using higher currents which cause more heat per inductor. This high current density may then cause the ACIs to overheat. The heat may destroy the inductors and any structures or material nearby.

This overheating may be addressed by placing thermal conductors near the inductors to draw heat away from the inductors toward a heat sink. The thermal conductor may take a few forms, such as high thermal conductivity, non-metallic cores within each ACI. Another form is a thermal jacket or surround around all or part of the exterior of the inductor. The pathway from the core or jacket may then lead to any of a variety of different heat sinks. An embedded thermoelectric cooler (TEC) may be used to "pump" heat away from the core. Strategically placing copper electrical traces near the ACI may distribute the heat to a cooler area of the substrate or to an external heat sink. A thermal interface material (TIM) may be applied to the end of a copper trace to conduct heat to a larger heat sink or even to protrusions on an Integrated Heat Spreader (IHS) to create a pathway for heat removal. An embedded thermistor may be used to measure the ACI temperature. The measured temperature may be applied to a controller with software to throttle back power or to increase the cooling in a TEC to prevent ACI overheating.

The high thermal conductivity core or jacket for an embedded ACI may be made of a variety of non-conducting materials or non-metallic materials. As a result, the inductor continues to perform as an air core inductor. While a metal or magnetic core conducts heat effectively, such a core also introduces electrical hysteresis effects which complicate electrical modeling and can reduce performance for semiconductor circuitry applications. With an electrically conductive core, eddy currents may also be created in the cores leading to power losses. Lorentz forces are also experienced with a metallic core, which leads to mechanical degradation of the part over time.

FIG. 1 is a side cross-sectional view diagram of an integrated circuit package with embedded ACIs each having a different embodiment of a cooling technique. The package 102 has a package substrate that carries an integrated circuit die 106 attached with a solder ball array with a fine pitch. The package substrate may be formed of a pre-preg (pre-impregnated resin) material, a fiberglass reinforced epoxy material, such as FR-4, build-up layers, such as ABF (Ajinomoto Build-Up Film), or any other suitable material.

The package substrate is covered and the die is sealed within the package with an integrated heat spreader (IHS) 110. A thermal interface material (TIM) 112 over the die between the die and the IHS conducts heat away from the die to the IHS. The package substrate has an array of pads or lands on a top side of the substrate to connect to the die using solder balls 108 at the fine pitch of the die and an array of solder balls 114 at a comparatively coarse pitch on a bottom side of the substrate for an external connection. The solder balls may be in the form of a land grid array (LGA), a surface mount array, or any other type of connector pad, land, or solder ball. The external connection surface 114 is for connection to a socket or directly to a circuit board such as a motherboard, daughter card, logic board or other type of system board.

Additional dies (not shown) may be attached to the top side of the substrate. The additional dies may contain memory, a specialized processor, passive devices or other components. They may be attached to lands or pads on the substrate and secured and sealed with an underfill or in any other way, depending on the intended use of the package. There may be many other dies of different types and sizes on the top side and on the bottom side of the substrate. There may also be other dies stacked over the primary integrated circuit die 106. While the primary die is discussed in the context of a central processing unit (CPU), other types of dies may be used including SoC (System on a Chip) dies. Similarly, the package may be for a specialized purpose or for multiple purposes such as a SiP (System in a Package).

The techniques described herein are particularly well suited for ACIs of a FIVR (Fully Integrated Voltage Regulator) but may be applied to other embedded coils for different applications. The coils may be part of an inductor, transformer, or other passive device. There may also be embedded coils for different functions with the same or different cooling techniques applied. In a FIVR, a multiple core die, typically but not necessarily a processor, has one or more voltage regulators formed on the die. Accordingly, the voltage regulator is in or very near the circuitry for which it supplies regulated voltage. This provides a precise and easily controlled voltage to the circuitry and allows parts of the die to be turned off or turned down to save power and to reduce the generation of waste heat. The voltage regulators each use an inductor that is not integrated on the die but instead is embedded within the package substrate. The greater space available within the package substrate allows for a larger higher quality inductor to be fabricated at lower overall cost than if the inductor were formed on the die.

In the illustrated example, there are five different air core inductors (ACIs) 121, 122, 123, 124, 125. Each air core inductor shows a different cooling system. A package substrate may use the same cooling system for all ACIs or it may use different cooling systems for different ACIs. In some embodiments, some ACIs may generate more heat or be closer to other ACIs. The hotter ACIs may be cooled differently than those that are less hot.

A first ACI 121 has a thermal conductor 131 in the form of a rod-shaped extension through the core of the inductor. The core provides a small and simple location from which much of the heat of the core may be absorbed by the rod of the thermal conductor and removed by conduction through the thermal conductor to another location.

The fifth ACI 125 has a thermal conductor 135 adjacent or around the exterior of the inductor. The conductor is in the shape of a surrounding thermal jacket, however, one or more rod-shaped extensions may be used instead or in addition. This may be more suitable for particular ACI fabrication, embedding, or placement situations. In some embodiments, an external conductor as for the fifth inductor 125 may be used to conduct heat from two nearby ACI at the same time because the conductor may be placed between two or more ACIs. Any of the cooling systems described herein may be used with either a core thermal conductor or an external thermal conductor. Alternatively, an ACI may have both a core rod thermal conductor and an exterior jacket thermal conductor. The two thermal conductors may use the same cooling technique and even be coupled together or two different cooling techniques may be used, one for the core and the other for the exterior.

The first thermal conductor 131 is coupled to three different cooling systems or heat sinks. These may all be used together in different combinations or any one may be used without any one of the others. The first heat sink is a thermo-electric element 142. This element actively pumps heat away from the embedded inductor. In some embodiments, the thermo-electric cooler element may be a cooler using the Peltier effect, for example a component constructed of bismuth-telluride elements sandwiched between parallel plates. Thermoelectric coolers may be considered to be active elements. The active device may be powered externally or through the electrical traces in the substrate.

As shown metal plates 144 within the substrate are coupled to the thermal conductor through the thermo-electric element 142. The plates 144 may be coupled directly to the thermal conductor rod 131 without benefit or the thermo-electric cooler 142. Plates such as those shown may be used to spread the heat through the substrate to reduce heat build-up in a small area in the substrate. The substrate may then be cooled by the ambient surrounding the substrate. The plates may be conventional traces similar to those used for wiring or they may be thicker or wider or larger in some other dimension in order to improve heat conduction. There may be multiple plates at different levels, as shown, in order to better distribute the heat through the substrate using the substrate as a part of the heat sink. Alternatively or in addition, one or more of the plates may reach the edge of the substrate and direct heat directly to the ambient though the plates instead of through the substrate.

From a lower vertical position within the substrate 104, the thermal conductor is coupled to a vertical via 145. The vertical via connects the plates 144 together so that all of the plates are used to diffuse the heat. The via may also or alternatively conduct heat from the inductor 121 rod 131 to the HIS 110 or another large heat sink.

The via, as shown, connects the thermal conductor 131 to multiple levels of plates. These plates may be formed specifically for cooling purposes to spread the heat through the substrate or to conduct the heat to the ambient. Alternatively, these may be the wiring layers intended to electrically connect data or power between the die above through the top side pads 108 and the socket or circuit board below through the bottom side pads 114. If the via is formed from a thermally conducting dielectric material, then the via may thermally connect any of the metal layers of the substrate without affecting the electrical connections. In this case, the plates closer to the land grid array 114 may be used to conduct more heat away from the substrate and away from the die.

In addition, the IHS 110 is coupled to the thermal conductor 131 through the plates 144 and the thermo-electric element 142. The IHS is made of a thermally conducting material, such as copper and is designed to radiate heat to the ambient or to a cooling system. In many devices, the IHS is thermally connected to heat fins, a liquid cooler, heat pipes, an external casing or some other larger heat sink. The heat produced by the inductors is small compared to the total thermal load carried by the IHS and dissipated through a larger cooling system.

As mentioned, the thermal conductor may be coupled to the vertical via 145 to further conduct heat from the inductor 121 to the IHS. The IHS may be connected to the via through some type of thermal interface material (TIM) 146 or paste to improve thermal conductivity. In this example, the heat spreader has a circumferential edge 111 that extends down from its main body to surround and protect the die 106 and then attach to the top of the substrate 104. The heat spreader also has a protrusion 147 that is aligned with the vertical via 145 to thermally connect to the via through the TIM. While a via may also connect through the edge of the heat spreader, this special protrusion allows for the via to be placed away from other wiring layers, simplifying the layout of the wiring layers within the substrate. Using the IHS or another larger external heat sink, a greater amount of heat may be removed from the inductor and from the substrate.

The second inductor 122 shows a more direct heat sink connection for the associated thermal conductor 132. In this example, the thermal conductor extends to the nearest exterior surface of the substrate 104. Any convenient exterior surface may be used, whether an upper, lower, or side surface of the substrate. The thermal conductor is coupled to a large pad 148 at the surface of the substrate which is coupled to an external heat sink 150. In this case the external heat sink is a block of thermal interface material, which may be filled polymer, metal or another material. Any other desired thermally conductive material may be used including a metal fin or rib.

While the second thermal conductor 132 conducts heat downward, the third thermal conductor 133 is thermally coupled to the third ACI 123 to conduct heat from the third ACI, in this case the core of the third ACI, upward. The thermal conductor ends in a large pad 152 which is embedded within the substrate to conduct heat into the substrate. This pad may be formed on the external upper surface of the substrate as in the example of the pad 148 for the second ACI 122. As shown, depending on the relative positions of the components, devices mounted to the top of the substrate, such as the die 106, may interfere with mounting cooling heat sinks directly over the ACIs. In such a case, the thermal conductors may extend laterally or connect to a metal trace that extends laterally to another position at which a connection may be made. This is shown for the first inductor 121 which is directly below the die 106. The thermal conductor extends laterally to a vertical via 145 in another location which is not directly under the die.

The fourth ACI 124 has a similar thermal conductor 134 in its core which like the second thermal conductor 132 extends downward to an external heat sink. In this example, the heat sink is a solder ball 156 of the solder ball or land grid array 114 on the package. This solder ball optionally connects to a matching land on the socket (not shown). The external solder ball conducts heat to the socket and may also be used to conduct heat to the circuit board to which the solder package is attached. If the package is directly attached to the circuit board, then the heat conduction is directly to the circuit board without any intervening socket.

In the example of the solder ball and in the example of the metal traces, the thermal conductors may connect to metal traces or solder balls that are also used to carry electrical signals. If the thermal conductors are formed of a material with little, low, or no electrical conductivity, then the inductors will not be in the electrical circuit of the trace or solder ball. This increases the thermal load on the other traces or solder balls, but it removes heat away from the inductors without requiring an additional heat sink structure.

In addition to the lateral trace 154 to a solder ball 156, the fourth ACI 124 also benefits from a local thermal sensor 160. This sensor may be in the form of a thermistor or in any other desired form that may be embedded in a substrate near an ACI. The thermal conductor 134 extends vertically upwards towards the thermal sensor. The thermal sensor is coupled to wiring traces 162 that connect to an external device 164, such as a controller. This external device may be a part of the package, a part of the die 106, a part of the power control system for the system or for the die, or a part of another system in some other location.

The thermistor may be used to monitor the ACI temperature. If the ACI or the surrounding substrate becomes too hot, then the power through the ACI may be reduced. A thermal control feedback loop including the thermal sensor 160 and the controller 164 allows for real time control of temperature. A software or hardware circuit may generate a high temperature signal and then special software in the controller or in the die or both may monitor the temperature and take action as needed to keep the temperature within specification. For an effective monitoring system, only a few or even one of the thermistors need be monitored. The general temperature of the substrate, the heat sinks, or the system's ability to absorb or eliminate the thermal load may be monitored using a small number of thermal sensors. As shown the fourth ACI 124 is coupled to both a thermal sensor 160 and a heat sink 156. Any of the ACI thermal cooling systems may be supplemented with a thermal sensor.

The fifth coil 125 has an external thermal conductor 135 and not a thermal conductor in the core. However, an ACI may have both types of thermal conductors for a single ACI. The external thermal conductor is coupled to the substrate as a heat sink and simply uses a large surface area embedded within the substrate to remove heat from the ACI and the area of the substrate immediately around the ACI. This is similar to the action of the embedded heat sink 152 of the third thermal conductor 133. Moving the heat from the ACI to another part of the substrate may provide enough cooling in some implementations. The thermal conductor may also be coupled to any of the other cooling systems as well or instead, including a thermoelectric element, metal plates, or an external sink, such as a special pad, an IHS, a solder ball, a socket or circuit board, or any other device.

As shown in FIG. 1, the heat from the ACIs may be dissipated into the substrate or it may be conducted to an external sink. There also may be different approaches for different ACIs. The substrate may be made of an insulating material or a material that has some thermal conductivity so that heat is distributed throughout the material and then conducted to the package cover 110, to the solder ball connections 156 and to any other heat absorbing structure that may be attached to the substrate. Even if the substrate material is a poor thermal conductor, it will have embedded electrically conducting layers and connecting vias to connect the die 106 above to the solder ball grid array 114 below. These electrically conducting layers, typically copper, will also conduct heat and tend to distribute heat throughout the substrate and to any components that are electrically or thermally connected to the substrate, such as the IHS, the solder ball arrays, and the ambient environment.

Figure 2:
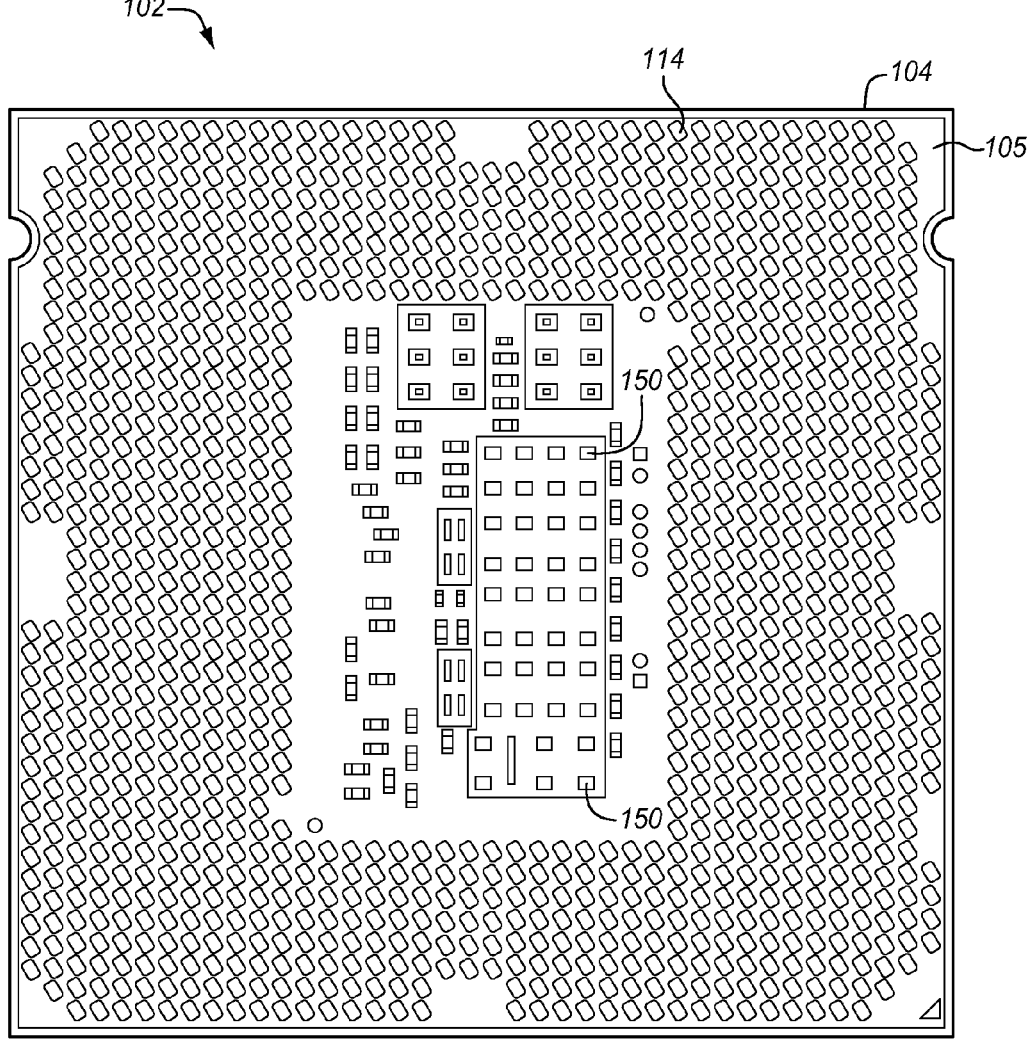
FIG. 2 is a bottom plan view of the integrated circuit package of FIG. 1 according to an embodiment.

FIG. 2 is a diagram of a bottom plan view of the package 102 of FIG. 1. The package substrate 104 has a bottom surface 105 with an array of electrical contacts 114, such as solder balls, or lands that may be connected to a socket or a circuit board. In a central area for better electrical connection to the die 106, an array of inductors has been embedded into the substrate. The inductors have an external outer heat radiating pad 150 to conduct heat out of each inductor and from the substrate. In this case, the heat will be conducted into the area surrounded by the lands and be absorbed by the socket or circuit board to which the package is attached.

Figure 3:
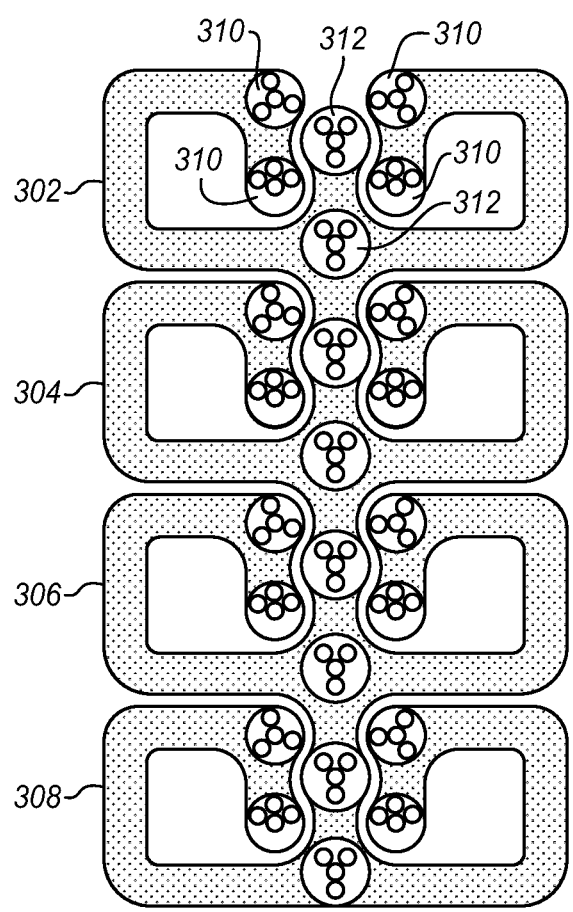
FIG. 3 is a top plan view of a sequence of coils with a thermal conductor according to an embodiment.

FIG. 3 is a top plan view of a sequence of coils suitable for use in an air coil inductor in the examples above. Four coils 302, 304, 306, 308 are shown, although there may be many more. The coils are shown in a one-dimensional vertical array, however, they may be formed in a two-dimensional array. The coils are connected in series so that the output of one coil is the input of the next to increase the total inductance of the combination. The coils may be separated or adjacent as shown. The coils may be formed by plating, depositing, printing, or dispensing one or more conductive, e.g. copper or other metal, layers on the substrate as the substrate is being formed. Alternatively, the coils may be embedded into a substrate after they are formed. Each coil may have multiple layers of metal stacked over each other to form multiple parallel windings. The ACI has a first set of contacts 310 or electrodes formed as vertical vias over the horizontal coil layers that connect to the power supply switch within the die as coil inputs. A second set of contacts 312 or electrodes connect to the voltage regulator within the die as outputs. The particular inputs and outputs may be adapted to suit any particular voltage regulator design.

Figure 4:
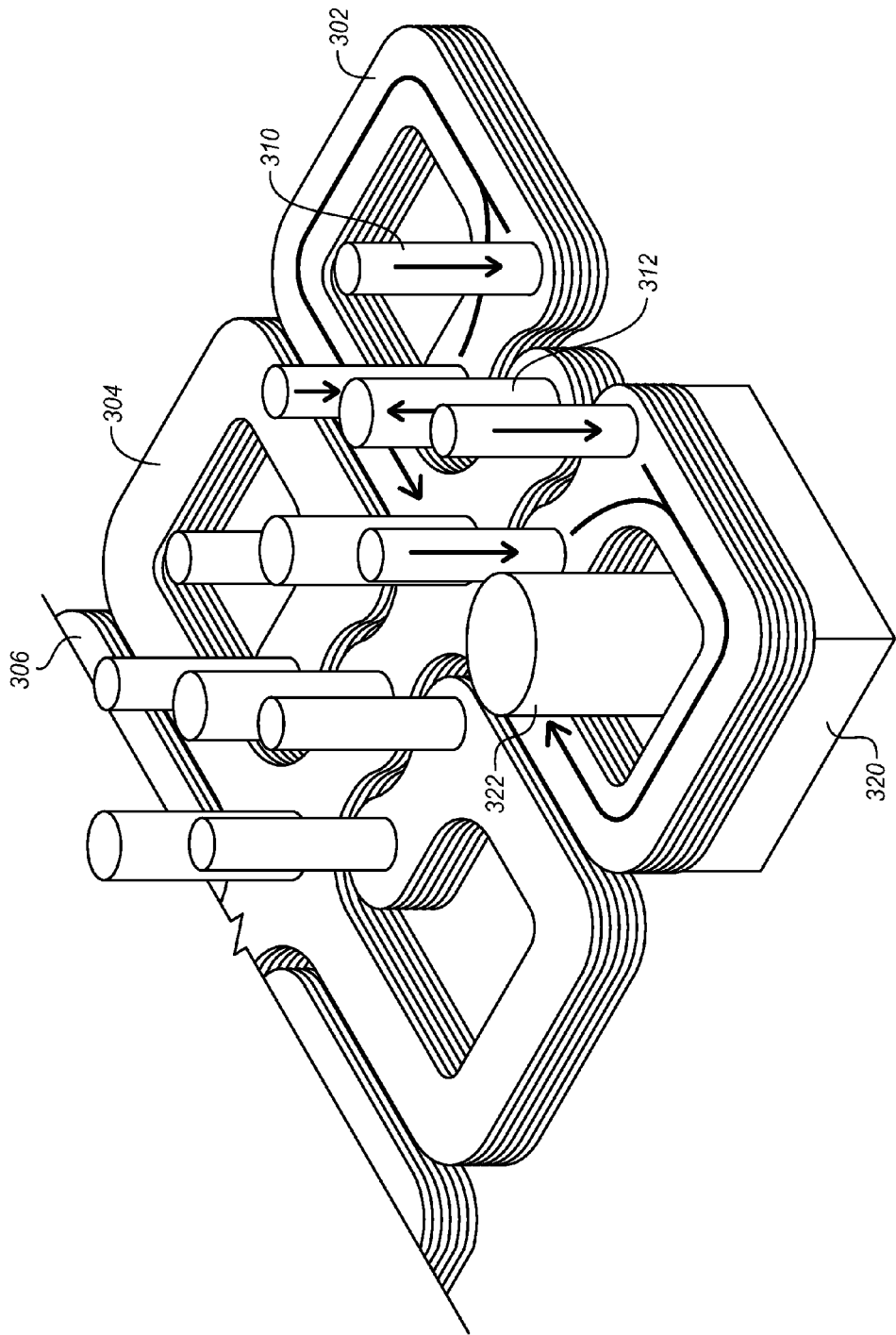
FIG. 4 is an isometric view of a portion of the coils of FIG. 3 according to an embodiment.

FIG. 4 is an isometric view of a portion of the ACI of FIG. 3. The multiple layer windings of the coil 302 have a thermal conductor 322 in the center of the coil. An external heat sink 320 is attached to the bottom end of the thermal conductor 322. While only one thermal conductor is shown, there may be a thermal conductor for some or all of the coils. Because the coils are electrically conducting, they may also be thermally conducting. As a result, a thermal conductor in one coil will tend to cool adjacent coils as heat is drawn from every electrically connected nearby structure. In this example, the thermal conductor may be formed integrally with the heat sink or as a separate structure. The heat sink 320 may alternatively be connected to any of a variety of other structures as shown in FIG. 1.

The coils with thermal conductors may be assembled in a variety of different ways. As an example, an ACI may be formed in build-up layers by plating between layers during substrate manufacturing. In this way, the coils are built at the same time as wiring layers. After the coils are built up, holes may be opened in the center of each coil or around the periphery for an outer jacket style thermal conductor. This may be done with a laser or another type of etching or drilling operation. A small rod of high thermal conductivity material may then be inserted into the hole. In one example, the rods may be formed on a plate and the plate may be placed over the coils. The rods are thermally coupled through the plate which would distribute the thermal load over a larger area than for the single pad version shown in FIG. 1. Such a plate is shown in FIG. 5.

The thermal conductors may be made of any of a variety of suitable thermally conducting dielectric materials. These materials include boron nitride or CVD (Chemical Vapor Deposition) industrial diamond. Pre-formed thermal conductors may be inserted into an ACI core with a pick-and-place chip shooter. A similar technique is used to attach capacitors that are embedded into substrates. These materials, among others, provide a thermal conductivity of about 1000 to 2000 W/MK, which is about five times better than the thermal conductivity of copper.

CVD diamond may be formed by growing a diamond wafer using a carbon-containing gas such as methane. A polycrystalline material may be formed with high thermal conductivity. The diamond wafer may be grown in the shape of a sheet 320 with bumps 322 (e.g. via masking), or it may be selectively oxidized (e.g. via laser) to create bumps. FIG. 5 is an example of such a sheet. While only 8 bumps are shown to provide thermal conductors for the coils of FIG. 4, there may be many more to provide thermal conductors for many more coils. The spacing between bumps is shown as even and symmetric, however, any suitable spacing may be used to accommodate the positions of the inductors.

Figure 5:
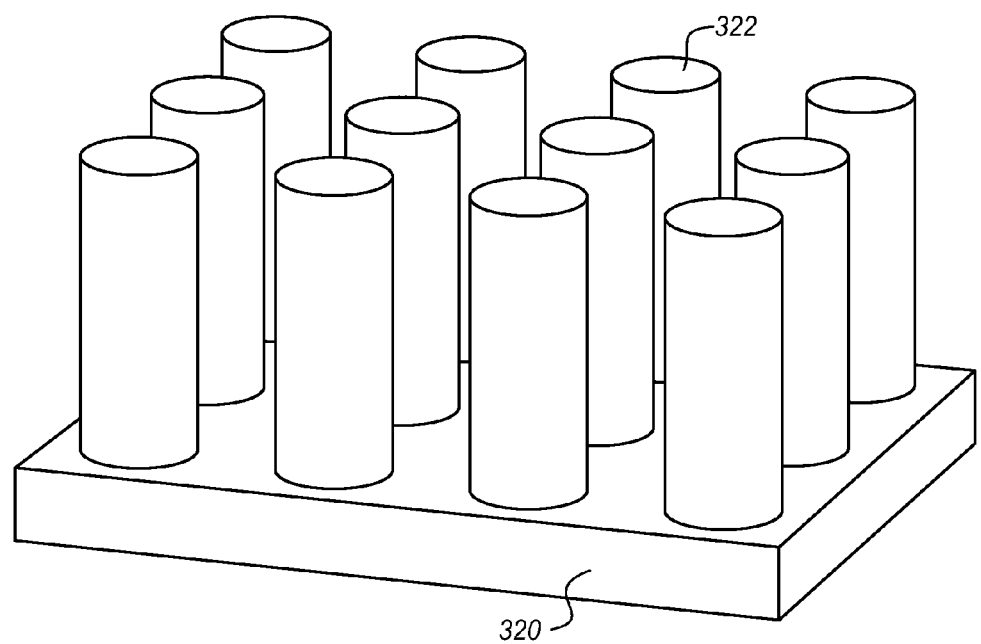
FIG. 5 is an isometric view of a thermal conductor for a sequence of coils according to an embodiment.

FIG. 5 is an isometric diagram of a heat sink 320 in the form of a sheet of thermally conducting material. An array of thermal conductors 322 in the form of bumps are formed over the sheet. The bumps may be used as rods to be inserted into the cores of an array of ACIs. The sheet may be used an external heat sink 150, an embedded heat sink 152 or a connector to another heat sink, such as metal layers, heat spreaders, package covers, solder balls etc. Alternatively, the sheet may be formed of another material and the individual rods 322 may be separated so that each ACI has an independent cooling system as suggested in FIG. 1.

By providing more effective ACI cooling, more power may be provided to smaller dies in smaller packages. This allows for higher power computing in smaller spaces which is useful for workstations and servers as well as for smaller clamshell and tablet computers.

Figure 6:
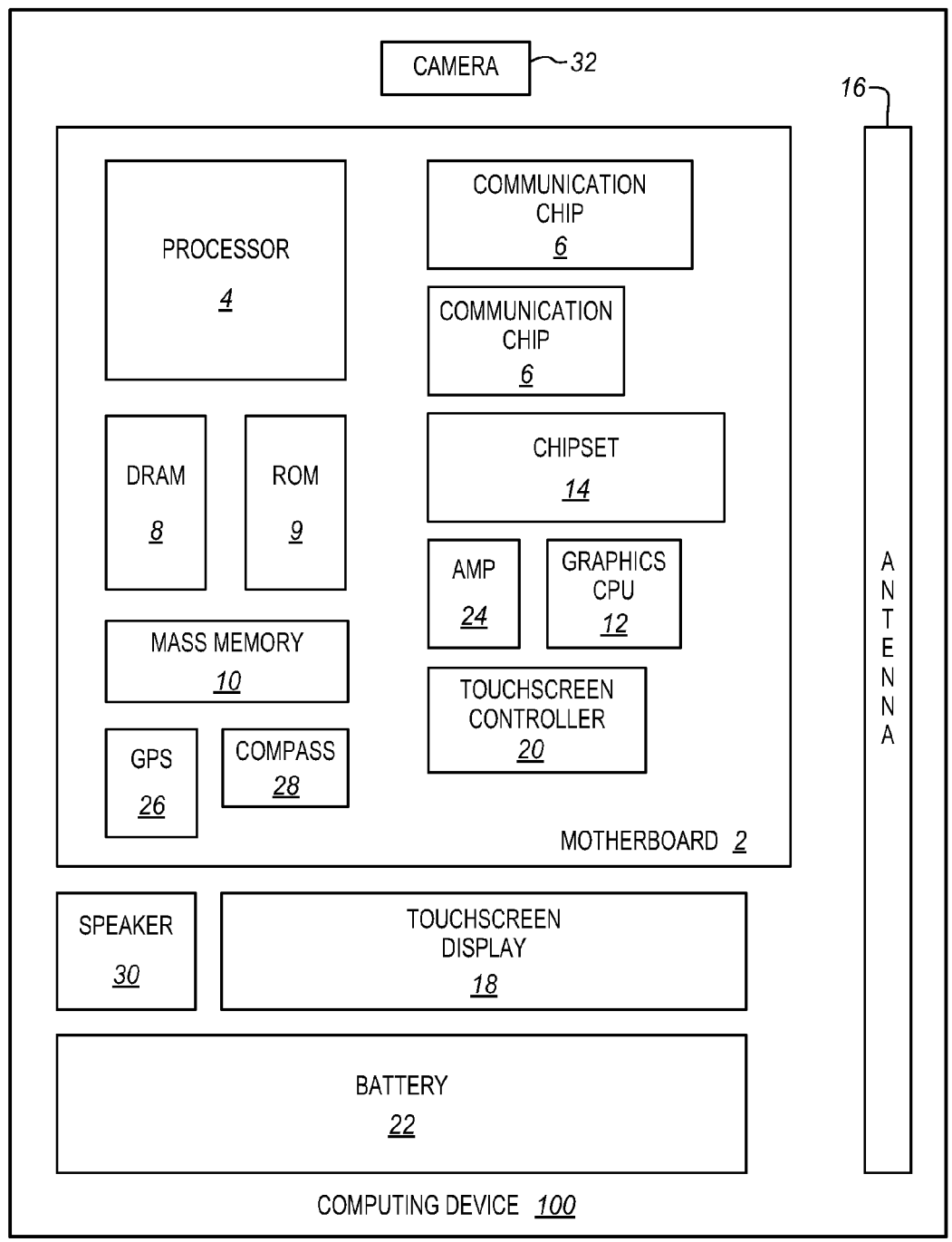
FIG. 6 is a block diagram of a computing device incorporating cooled coils in an integrated circuit die package according to an embodiment.

FIG. 6 illustrates a computing device 11 in accordance with one implementation of the invention. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 11 includes an integrated circuit die packaged within the processor 4. In some implementations of the invention, the integrated circuit die of the processor, memory devices, communication devices, or other components include or are packaged using embedded coils and embedded thermal conductors in die packages as described herein. The coils may be for inductors, transformers, or other components. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a package substrate to carry an integrated circuit die, the package substrate having a plurality of top side pads to connect to the die on a top side and a plurality of bottom side pads to connect to an external component on a bottom side, an inductor embedded within the package substrate, a thermal conductor embedded within the package substrate adjacent to the inductor to conduct heat away from the inductor, and a heat sink thermally coupled to the thermal conductor to receive the heat from the conductor.

In further embodiments the thermal conductor is a dielectric.

In further embodiments the thermal conductor is formed of a nitride, a polymer, or an industrial diamond.

In further embodiments the inductor has coils and wherein the thermal conductor is within the coils of the inductor.

In further embodiments the thermal conductor has a rod-shaped extension that is within the inductor core.

In further embodiments the inductor has coils and wherein the thermal conductor is outside the coils of the inductor.

In further embodiments the thermal conductor comprises a jacket surrounding the exterior of the inductor.

In further embodiments the heat sink comprises a thermoelectric cooler.

In further embodiments the heat sink comprise metal traces within the package substrate.

In further embodiments the metal traces conduct data between a top side pad and a bottom side pad.

In further embodiments the heat sink comprises a thermally conducting material attached to an exterior surface of the package substrate.

In further embodiments the thermally conducting material comprises a solder ball.

In further embodiments the thermally conducting material comprises a heat spreader over the die and the package substrate.

Further embodiments include a thermal detector coupled to the thermal conductor to detect a representation of the temperature of the inductor, the thermal detector being coupled to an external controller.

Some embodiments pertain to an integrated circuit package that includes a processor having a voltage regulator, a package substrate to carry the processor, the package substrate having a plurality of top side pads to electrically connect to the processor and a plurality of bottom side pads to connect to an external component on a bottom side, an inductor embedded within the package substrate and connected to the voltage regulator of the processor through the top side pads, a thermal conductor embedded within the package substrate adjacent to the inductor to conduct heat away from the inductor, and a heat sink thermally coupled to the thermal conductor to receive the heat from the conductor.

In further embodiments the heat sink comprises a thermally conductive vertical via through the package substrate to an external heat sink.

In further embodiments the thermal conductor comprises a polycrystalline diamond rod through a core of the inductor.

Some embodiments pertain to a computing system that includes a system board, a memory attached to the system board, a processor connected to the memory, a package substrate attached to the system board to carry the processor, the package substrate having a plurality of top side pads to electrically connect to the processor, a passive device having a conductive coil embedded within the package substrate and connected to the processor through the top side pads, a thermal conductor embedded within the package substrate adjacent to the inductor to conduct heat away from the inductor, and a heat sink thermally coupled to the thermal conductor to receive the heat from the conductor.

In further embodiments the heat sink comprises metal layers of the substrate.

In further embodiments the heat sink comprises a bottom side pad of the substrate coupled to the system board.

What is claimed is:

1. An apparatus comprising:
   a package substrate to carry an integrated circuit die, the package substrate having a plurality of top side pads to connect to the die on a top side and a plurality of bottom side pads to connect to an external component on a bottom side;
   an inductor embedded within the package substrate;
   a thermal conductor embedded within the package substrate adjacent to the inductor to conduct heat away from the inductor; and
   a heat sink thermally coupled to the thermal conductor to receive the heat from the conductor.

2. The apparatus of claim 1, wherein the thermal conductor is a dielectric.

3. The apparatus of claim 2, wherein the thermal conductor is formed of a nitride, a polymer, or an industrial diamond.

4. The apparatus of claim 2, wherein the inductor has coils and wherein the thermal conductor is within the coils of the inductor.

5. The apparatus of claim 2, wherein the thermal conductor has a rod-shaped extension that is within the inductor core.

6. The apparatus of claim 1, wherein the inductor has coils and wherein the thermal conductor is outside the coils of the inductor.

7. The apparatus of claim 6, wherein the thermal conductor comprises a jacket surrounding the exterior of the inductor.

8. The apparatus of claim 1, wherein the heat sink comprises a thermoelectric cooler.

9. The apparatus of claim 1, wherein the heat sink comprise metal traces within the package substrate.

10. The apparatus of claim 9, wherein the metal traces conduct data between a top side pad and a bottom side pad.

11. The apparatus of claim 1, wherein the heat sink comprises a thermally conducting material attached to an exterior surface of the package substrate.

12. The apparatus of claim 11, wherein the thermally conducting material comprises a solder ball.

13. The apparatus of claim 11, wherein the thermally conducting material comprises a heat spreader over the die and the package substrate.

14. The apparatus of claim 1, further comprising a thermal detector coupled to the thermal conductor to detect a representation of the temperature of the inductor, the thermal detector being coupled to an external controller.

15. An integrated circuit package comprising:
    a processor having a voltage regulator;
    a package substrate to carry the processor, the package substrate having a plurality of top side pads to electrically connect to the processor and a plurality of bottom side pads to connect to an external component on a bottom side;
    an inductor embedded within the package substrate and connected to the voltage regulator of the processor through the top side pads;
    a thermal conductor embedded within the package substrate adjacent to the inductor to conduct heat away from the inductor; and
    a heat sink thermally coupled to the thermal conductor to receive the heat from the conductor.

16. The package of claim 15, wherein the heat sink comprises a thermally conductive vertical via through the package substrate to an external heat sink.

17. The package of claim 15, wherein the thermal conductor comprises a polycrystalline diamond rod through a core of the inductor.

18. A computing system comprising:
    a system board;
    a memory attached to the system board;
    a processor connected to the memory;
    a package substrate attached to the system board to carry the processor, the package substrate having a plurality of top side pads to electrically connect to the processor;
    a passive device having a conductive coil embedded within the package substrate and connected to the processor through the top side pads;
    a thermal conductor embedded within the package substrate adjacent to the inductor to conduct heat away from the inductor; and
    a heat sink thermally coupled to the thermal conductor to receive the heat from the conductor.

19. The computing system of claim 18, wherein the heat sink comprises metal layers of the substrate.

20. The computing system of claim 18, wherein the heat sink comprises a bottom side pad of the substrate coupled to the system board.

* * * * *